(12) United States Patent
Overweg

(10) Patent No.: US 10,989,777 B2
(45) Date of Patent: Apr. 27, 2021

(54) GRADIENT SYSTEM WITH CONTROLLED COOLING IN THE INDIVIDUAL GRADIENT CHANNELS

(71) Applicant: KONINKLIJKE PHILIPS N.V., Eindhoven (NL)

(72) Inventor: Johannes Adrianus Overweg, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 16/485,503

(22) PCT Filed: Feb. 20, 2018

(86) PCT No.: PCT/EP2018/054086
§ 371 (c)(1),
(2) Date: Aug. 13, 2019

(87) PCT Pub. No.: WO2018/150037
PCT Pub. Date: Aug. 23, 2018

(65) Prior Publication Data
US 2020/0049779 A1 Feb. 13, 2020

(30) Foreign Application Priority Data
Feb. 20, 2017 (EP) .................................. 17156825

(51) Int. Cl.
*G01R 33/385* (2006.01)
*G01R 33/54* (2006.01)
*G01R 33/56* (2006.01)

(52) U.S. Cl.
CPC ..... *G01R 33/3856* (2013.01); *G01R 33/3858* (2013.01); *G01R 33/543* (2013.01); *G01R 33/546* (2013.01); *G01R 33/56* (2013.01)

(58) Field of Classification Search
CPC ............ G01R 33/3856; G01R 33/3858; G01R 33/543; G01R 33/546; G01R 33/56
See application file for complete search history.

(56) References Cited

U.S. PATENT DOCUMENTS 6,236,207 B1   5/2001   Arz et al.
7,135,863 B2 * 11/2006   Arik .................. G01R 33/3856
                                                              324/318

(Continued)

FOREIGN PATENT DOCUMENTS

JP      0654819 A      3/1994
JP      11244255 A     9/1999

OTHER PUBLICATIONS

International Search Report from PCT/EP2018/054086 dated Jun. 12, 2018.

*Primary Examiner* — Susan S Lee

(57) ABSTRACT

A gradient coil system for a magnetic resonance imaging system includes a plurality of gradient coils for applying a gradient magnetic field to a target volume; at least one coolant tube per gradient coil for cooling the gradient coil (110A-C, 210A-C). The coolant tubes are connected to respective flow control devices and a controller, which is configured to control each flow control device of the flow control devices for adjusting the flow of a coolant in the respective coolant tube. The controller is configured to control the flow control device on the basis of heat load caused by the respective gradient coil.

14 Claims, 5 Drawing Sheets

(56) References Cited

U.S. PATENT DOCUMENTS

| | | | |
|---|---|---|---|
| 7,301,343 B1 | 11/2007 | Sellers | |
| 2002/0156595 A1 | 10/2002 | Hedlund et al. | |
| 2004/0017195 A1* | 1/2004 | Kassai | G01R 33/3856 |
| | | | 324/315 |
| 2005/0035764 A1* | 2/2005 | Mantone | G01R 33/3856 |
| | | | 324/318 |
| 2010/0271028 A1* | 10/2010 | Kawamoto | G01R 33/3873 |
| | | | 324/318 |
| 2011/0167924 A1 | 7/2011 | Kimmlingen | |
| 2015/0123661 A1 | 5/2015 | Yui et al. | |
| 2019/0310333 A1* | 10/2019 | Ham | G01R 33/3804 |

* cited by examiner

GRADIENT SYSTEM WITH CONTROLLED COOLING IN THE INDIVIDUAL GRADIENT CHANNELS

CROSS REFERENCE TO RELATED APPLICATIONS

This application is a U.S. national phase application of International Application No. PCT/EP2018/054086 filed on Feb. 20, 2018, which claims the benefit of EP Application Serial No. 17156825.6 filed on Feb. 20, 2017 and is incorporated herein by reference.

FIELD OF THE INVENTION

The invention relates to scanning imaging systems, in particular to a cooling system for a gradient coil apparatus.

BACKGROUND OF THE INVENTION

A chiller utilizing water or a water and ethylene glycol mixture is typically used for removing heat from gradient coils of magnetic resonance (MR) systems. In order to minimize the flow impedance, the cooling systems consist of a number of parallel circuits served by the chiller. However, the gradient coils are not usually used at the same duty cycle and much of the capacity of the cooling system is wasted.

The Japanese patent application JP H06-54819 relates to an open-type magnet with opposing pole pieces of a permanent magnet. Gradient coils are mounted to the respective pole pieces. These gradient coils are liquid cooled and the cooling for x-gradient coil and they-gradient coil of the same pole pieces are circuited in series. Cooling of the gradient (x,y) coils at different pole pieces is controlled separately

SUMMARY OF THE INVENTION

Various embodiments provide for a gradient coil system, magnetic resonance imaging system, method for cooling a gradient coil system and computer program product, as described by the subject matter of the independent claims. Advantageous embodiments are described in the dependent claims.

In one aspect, the invention relates to a gradient coil system for an MR imaging system. The gradient coil system comprises: a plurality of gradient coils for applying a gradient magnetic field to a target volume, at least one coolant tube per gradient coil for cooling the gradient coil, the coolant tubes being connected to respective flow control devices, a controller coupled to the coolant tubes configured to control each flow control device of the flow control devices for adjusting the flow of a coolant in the respective coolant tube, wherein the controller is configured to control the flow control device on the basis of heat load caused by the respective gradient coil.

For example, a given gradient coil of the gradient coils may have multiple parallel coolant tubes enabling parallel flow paths. In other terms, the at least one coolant tube of the given gradient coil comprises multiple coils. Having multiple tubes in parallel may reduce flow resistance e.g. for cooling water. In another example, each gradient coil of the gradient coils may have multiple parallel coolant tubes enabling parallel flow paths.

In other terms, each gradient coil of the gradient coils is associated with a cooling circuit for cooling the gradient coil. The cooling circuit comprises the at least one coolant tube. The adjusting of the flow rate in each cooling circuit of the cooling circuits may further comprise adjusting the total flow rate of the coolant that is pumped e.g. by a pump that is connected to the coolant tubes for circulating the coolant in the coolant tubes. In case a cooling circuit comprises multiple coolant tubes, the flow rate of the cooling circuit may be equally distributed over the multiple coolant tubes of the cooling circuit.

For example, the gradient coil system may have several (X, Y and Z) gradient channels, each channel having associated a gradient coil and current supply for supplying the gradient coil with electrical current to generate a gradient magnetic field in the direction (X, Y or Z) the channel is associated with. The gradient coil system may be fluid (e.g. water) cooled to remove heat generated by electrical currents. The individual gradient channels are provided with a flow control device to control the flow of coolant for the gradient channel. The flow control devices may be controlled on the basis of a predicted heat load for a planned MR acquisition sequence that includes a selected set of gradient pulses. Notably, the gradient coil system may be provided with hollow electrical conductors of the gradient coils and coolant is passed through the interior passages of the conductors.

The flow control device refers to a device that is controllable to vary the flow of a coolant (e.g. fluid) through a passage or otherwise from one location to another or is controllable to change the inlet temperature of the coolant. For example, the flow control device may be controllable to vary the flow from zero or no flow, such as when the flow control device is fully closed, to 100% flow rate, such as when the flow control device is fully open. The flow control device may for example comprise a valve or a pump.

The present system and method may enable a more efficient use of the cooling capacity of the coolant. The cooling power of the gradient coils may individually be controlled by adjusting flow rates using the flow control devices. This may especially be advantageous in gradient systems operating for the so-called ZTE scanning where the gradients are on almost permanently.

By efficiently adapting the flow rates of the coolant to lower the temperature of the gradient coils acquisition time and image properties such as resolution and contrast may be improved (shorter acquisition time). In particular, it may become possible to eliminate idle time in the planned MR acquisition sequence, otherwise needed to stay within thermal limits of the gradient coil, or the duration of large flow-encoding gradients can be reduced if their amplitude can be increased without overheating the gradient coil.

The present system and method may enable to split the coolant flow from a water cooling system (e.g. chiller) into parallel streams depending on how the gradient coils are actually used. This may particularly be useful for the so-called ZTE scanning method, where the gradient coils are on almost permanently, with slowly varying orientation of the gradient vector. Each gradient channel has an independent water cooling circuit, which can be either the hollow conductor of the gradient coil in question or a cooling system directly in contact with this gradient coil. Each of the cooling circuits has a flow control device limiting the flow rate in that particular channel or circuit. The flow control devices may be set automatically, based on predicted heat loads resulting from the scan being performed or by measuring outlet temperatures of the coolant circuits, in such a way that the flow from the chiller is optimally used.

The flow control devices may be control valves (modulating valves). The control valve may be used to control fluid flow by varying the size of the flow passage as directed by a signal from the controller. The size of the flow passage may be a desired degree of opening. This may enable the direct control of flow rate. Each flow control device of the flow control devices may comprise positioners (e.g. valve positioners) that are used to ensure the flow control device attains the desired degree of opening.

According to one embodiment, the heat load is a predicted heat load based on planned MR acquisition pulse sequences for MR data acquisition and using a pre-calibrated heating model of the gradient coil. In other terms, this embodiment is about predicting the power dissipation and the resulting temperature rise in the gradient coil based on the scan that will be performed next and adjusting the cooling of the gradient coils accordingly. The power dissipated in each gradient coil may be estimated using the electrical current pulse pattern applied to the gradient coil as defined from the pulse sequence to be used for MR data acquisition. For example, a scan controller of the MRI system may predict how much power will be dissipated in each gradient coil and the flow control devices are configured (e.g. opened or closed) in such a way that the temperature drop across each of the three cooling circuits is approximately equal. The at least one coolant tube or coolant pipe that is associated with each gradient coil is also referred to as cooling circuit herein. In order to limit the hydraulic impedance of the cooling circuits, each cooling circuit may in itself comprise multiple parallel coolant flow paths.

This embodiment may be advantageous as it may prevent in advance the heating of the gradient coils based on an accurate estimation of the heat load.

According to one embodiment, the flow control devices are further adjustable on the basis of the outlet temperature of the coolant during the MR data acquisition after the coolant has passed the respective coolant tube. Having the monitoring of the heat load in addition to the outlet temperature may compensate for a potential under or over estimation of the heat load as performed by the scan controller. For example, if the distribution of the gradient current over the three gradient coils changes during a scan, the flow control device settings are continuously adapted to compensate for these changes. The setting or adjusting of the flow control device can be based on the required gradient outputs (which are known by the scan controller), or based on measured coil temperatures.

According to one embodiment, the heat load is a measured outlet temperature of the coolant during the MR data acquisition. In another example, the heat load may be determined by sensing the total resistance of the individual gradient coils by measuring currents through the coils and voltages across the coils. This embodiment may enable a continuous monitoring of the heat load for enabling a timely reaction to an unexpected increase in the heat load.

According to one embodiment, the heat load comprises heat load of each gradient coil of the gradient coils.

According to one embodiment, the flow control devices are automatically configurable. For example, upon or in response to determining the heat load, the flow control devices may automatically be configured accordingly.

For example, the flow control devices may comprise valves that can be electrically actuated. In this case, the valves may have to be either insensitive to magnetic field of the MR imaging system or located sufficiently far away from the main magnetic field that the field is small enough to operate. Alternatively, the valves can be pneumatically or hydraulically controlled.

According to one embodiment, a flow control device of the flow control devices comprises a valve having a switching loop (or valve actuator) for changing the valve from an open to a closed position or from the closed to the open position. For example, each flow control device of the flow control devices comprises a valve having a switching loop.

According to one embodiment, a flow control device of the flow control devices comprises a valve having a valve actuator (or valve positioner) for setting the valve to a position corresponding to a predefined flow rate of the coolant for absorbing the heat load. For example, each flow control device of the flow control devices comprises a valve having a valve actuator.

These embodiments may enable to control the size of the flow passage or degree of opening of the flow control device. This may ensure the flow control device attains the desired degree of opening and thus control of flow rate.

According to one embodiment, the coolant tubes are hollow conductors of the gradient coils or coolant pipes in contact with the gradient coils. This may provide a compact design of the gradient coil system.

In another aspect, the invention relates to a MRI system comprising the gradient coil system of any of the preceding embodiments.

In another aspect, the invention relates to a method for cooling a gradient coil system of a magnetic resonance imaging, MRI, system, the gradient coil system comprising a plurality of gradient coils for applying a gradient magnetic field to a target volume, coolant tubes for cooling the gradient coils, the coolant tubes being connected to respective flow control devices. The method comprises: determining the heat load of the gradient coil system; controlling each flow control device of the flow control devices in accordance with the determined heat load, thereby adjusting the flow of a coolant in the respective coolant tube.

According to one embodiment, controlling the flow control device comprises adjusting an operating parameter of the flow control device, and sending a control signal for operating the flow control device in accordance with the adjusted operating parameter, the operating parameter comprising at least one of: flow rate of the coolant in the flow control device and the inlet temperature of the coolant in the flow control device.

In another aspect, the invention relates to a computer program product comprising machine executable instructions for execution by a processor, wherein execution of the machine executable instructions causes the processor to the methods of preceding embodiments.

It is understood that one or more of the aforementioned embodiments of the invention may be combined as long as the combined embodiments are not mutually exclusive.

BRIEF DESCRIPTION OF THE DRAWINGS

In the following preferred embodiments of the invention will be described, by way of example only, and with reference to the drawings in which.

DETAILED DESCRIPTION OF EMBODIMENTS

In the following, like numbered elements in the figures are either similar elements or perform an equivalent function.

Elements which have been discussed previously will not necessarily be discussed in later figures if the function is equivalent.

Various structures, systems and devices are schematically depicted in the figures for purposes of explanation only and so as to not obscure the present invention with details that are well known to those skilled in the art. Nevertheless, the attached figures are included to describe and explain illustrative examples of the disclosed subject matter.

Figure 1:
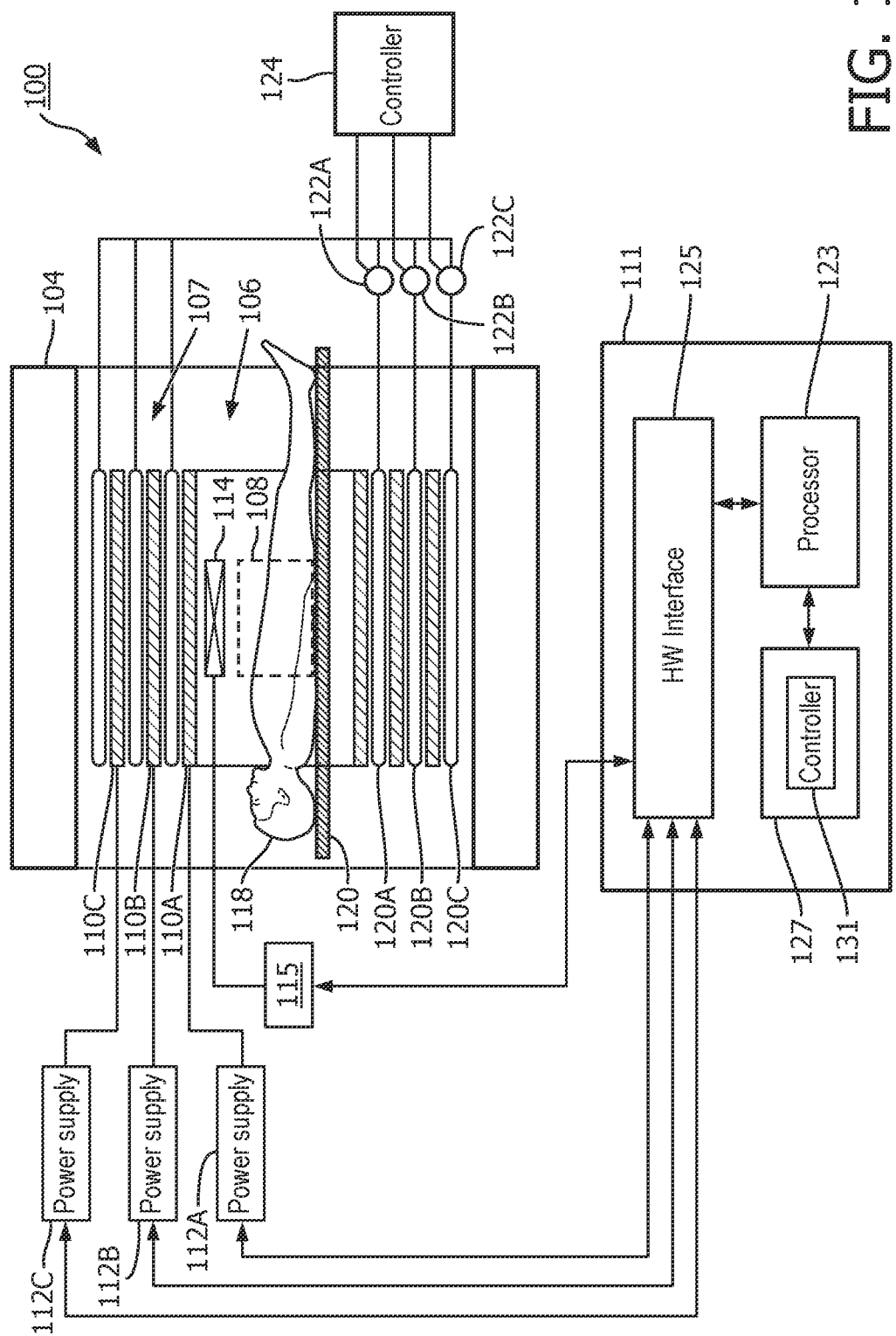
FIG. 1 shows a cross-sectional and functional view of an MRI system.

FIG. 1 illustrates a magnetic resonance imaging system 100 as an example of the medical system 100. The magnetic resonance imaging system 100 comprises a magnet 104. The magnet 104 is a superconducting cylindrical type magnet with a bore 106 in it. The use of different types of magnets is also possible; for instance, it is also possible to use both a split cylindrical magnet and a so called open magnet. A split cylindrical magnet is similar to a standard cylindrical magnet, except that the cryostat has been split into two sections to allow access to the iso-plane of the magnet. Such magnets may for instance be used in conjunction with charged particle beam therapy. An open magnet has two magnet sections, one above the other with a space in-between that is large enough to receive a subject 118 to be imaged, the arrangement of the two sections area similar to that of a Helmholtz coil. Inside the cryostat of the cylindrical magnet there is a collection of superconducting coils. Within the bore 106 of the cylindrical magnet 104 there is an imaging zone or volume or anatomy 108 where the magnetic field is strong and uniform enough to perform magnetic resonance imaging.

MRI system 100 further comprises an RF coil 114 at the subject 118 and adjacent to the examination volume 108 for generating RF excitation pulses. The RF coil 114 may include for example a set of surface coils or other specialized RF coils. The RF coil 114 may be used alternately for transmission of RF pulses as well as for reception of magnetic resonance signals e.g., the RF coil 114 may be implemented as a transmit array coil comprising a plurality of RF transmit coils. The RF coil 114 is connected to one or more RF amplifiers 115.

Within the bore 106 of the magnet there is a set of magnetic field gradient coils 110A-C which is used during acquisition of magnetic resonance data to spatially encode magnetic spins of a target volume within the imaging volume or examination volume 108 of the magnet 104. Typically, magnetic field gradient coils 110A-C contain three separate sets of coils for the encoding in three orthogonal spatial directions. A magnetic field gradient power supply 112A-C supplies current to the magnetic field gradient coils. The current supplied to the magnetic field gradient coils 110A-C is controlled as a function of time and may be ramped or pulsed.

Magnetic field gradient coils 110A-C may be grouped in a gradient coil assembly or apparatus or system 107. The gradient coils 110A-C have different physical configurations adapted to their function in the MRI system 100.

Based on the design, the gradient coils 110A-C may be arranged such that a cooling system may be placed. For example, certain spaces between the gradient coils may be allocated for placement of the cooling system. The cooling system is provided to improve the heat removal of the heat generated by the gradient coils 110A-C. The cooling system may comprise cooling circuits 120A-C. Cooling circuits 120A-C may be thermally connected to respective gradient coils 110A-C. For example, a cooling circuit 120A-C may comprise at least one coolant tube forming a helix about an outer diameter surface of respective gradient coil 110A-C.

For example, a cooling circuit e.g. 120A may comprise multiple parallel coolant tubes. The cooling circuits 120A-C may be held in place by, for example, respective layers of epoxy. Cooling circuits 120A-C may be coupled to a chiller (not shown). Cooling circuits 120A-C may be serially connected to respective flow control devices 122A-C. The flow control devices 122A-C are individually and/or independently controlled by a controller 124 in order to control the flow of the coolant in the cooling circuits 120A-C. The cooling system is further described in FIGS. 2-3.

The RF amplifier 115 and gradient power supplies 112A-C are connected to a hardware interface 125 of control system 111. The memory 127 of control system 111 may for example comprise a scan controller 131. The scan controller 131 contains computer-executable code which enables the processor 123 to control the operation and function of the magnetic resonance imaging system 100. It also enables the basic operations of the magnetic resonance imaging system 100 such as the acquisition of magnetic resonance data.

Figure 2:
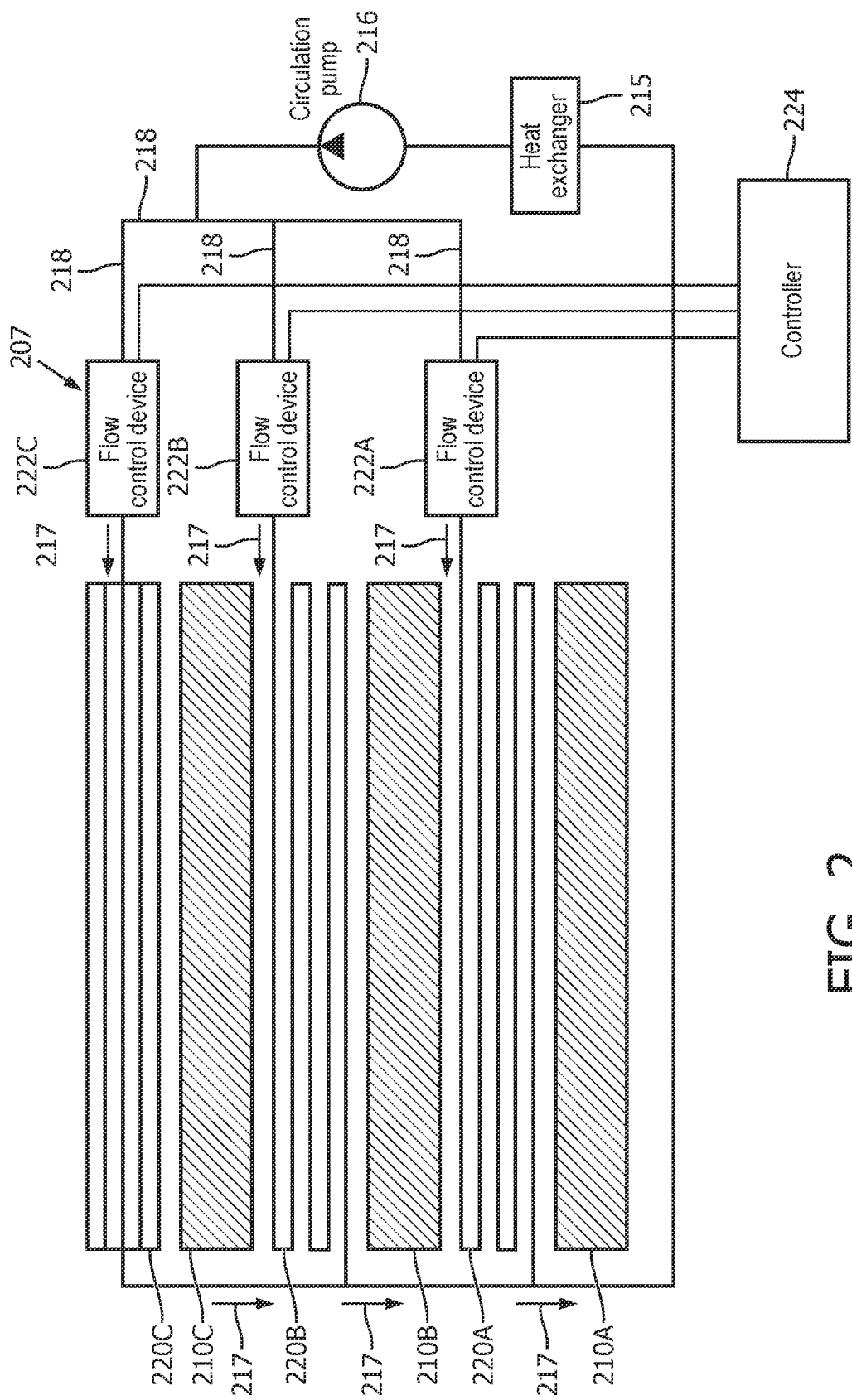
FIG. 2 is a schematic diagram representing the structure of a gradient coil apparatus.

FIG. 2 is a schematic diagram representing the structure of a gradient coil apparatus (or gradient coil system) 207, for a MRI imaging system e.g. 100, in accordance with an example of the present disclosure. The gradient coil apparatus comprises gradient coils 210A-C for generating gradient magnetic field in each axial direction. For example, the gradient coils 210A-C may respectively generate X-axis gradient magnetic field where the gradient of the magnetic field is orthogonal to the static magnetic field; Y-axis gradient magnetic field where the gradient of the magnetic field is orthogonal to the static magnetic field; and Z-axis gradient magnetic field where the spatial direction of the gradient is parallel to the static magnetic field. Each gradient coil 210A-C is connected with the power supply and generates Joule heat when power is supplied according to a desired sequence.

The gradient coil apparatus 207 further comprises a cooling circuit 220A-C associated with respective gradient coil 210A-C. Each cooling circuit 220A-C is serially connected to a flow control device 222A-C. Each cooling circuit may in itself comprise multiple parallel flow paths, with the objective to reduce the hydraulic impedance of the cooling circuit. The cooling circuits 220A-C are connected to a heat exchanger 215 installed separately from the gradient coil apparatus and a circulation pump 216 e.g. using a pipe 218. For example, water or a water and ethylene glycol mixture, or a coolant having dielectric or non-dielectric fluid mixtures, may be used as a coolant flowing in the cooling circuits 220A-C for removing heat from gradient coils 210A-C. The circulation pump 16 causes the coolant to circulate. The coolant is circulated in the circulation direction 217. The flow of the coolant in each of the cooling circuits 220A-C is controlled by controller 224 using flow control devices 222A-C respectively. The control may individually and/or independently be performed for each of the cooling circuits 220A-C. For example, the control of the flow rate using the flow control devices 222A-C may be based on the heat load of the gradient coil apparatus as described with reference to FIG. 4.

Controller 224 may for example be part of the computer system 111 or may be part of a separate system that is connected to computer system 111. For example, the controller 224 may receive heat load estimations from the scan controller 131 (e.g. before as can starts). The heat load estimations may be performed by the scan controller 131. In another example, the heat load estimations may be performed by controller 224 using information on the pulse sequences to be used for a MR acquisition. This information may be received by the controller 224 from the scan controller 131 or may be input by a user to the controller 224.

This figure also illustrates that a cooling circuit can consist of multiple parallel flow paths: the cooling circuit 220C has five parallel coolant tubes whereas the cooling circuits 220A and 220B are shown as one single coolant tube. Multiple parallel paths are often useful to limit the pressure drop across the cooling system.

Figure 3A:
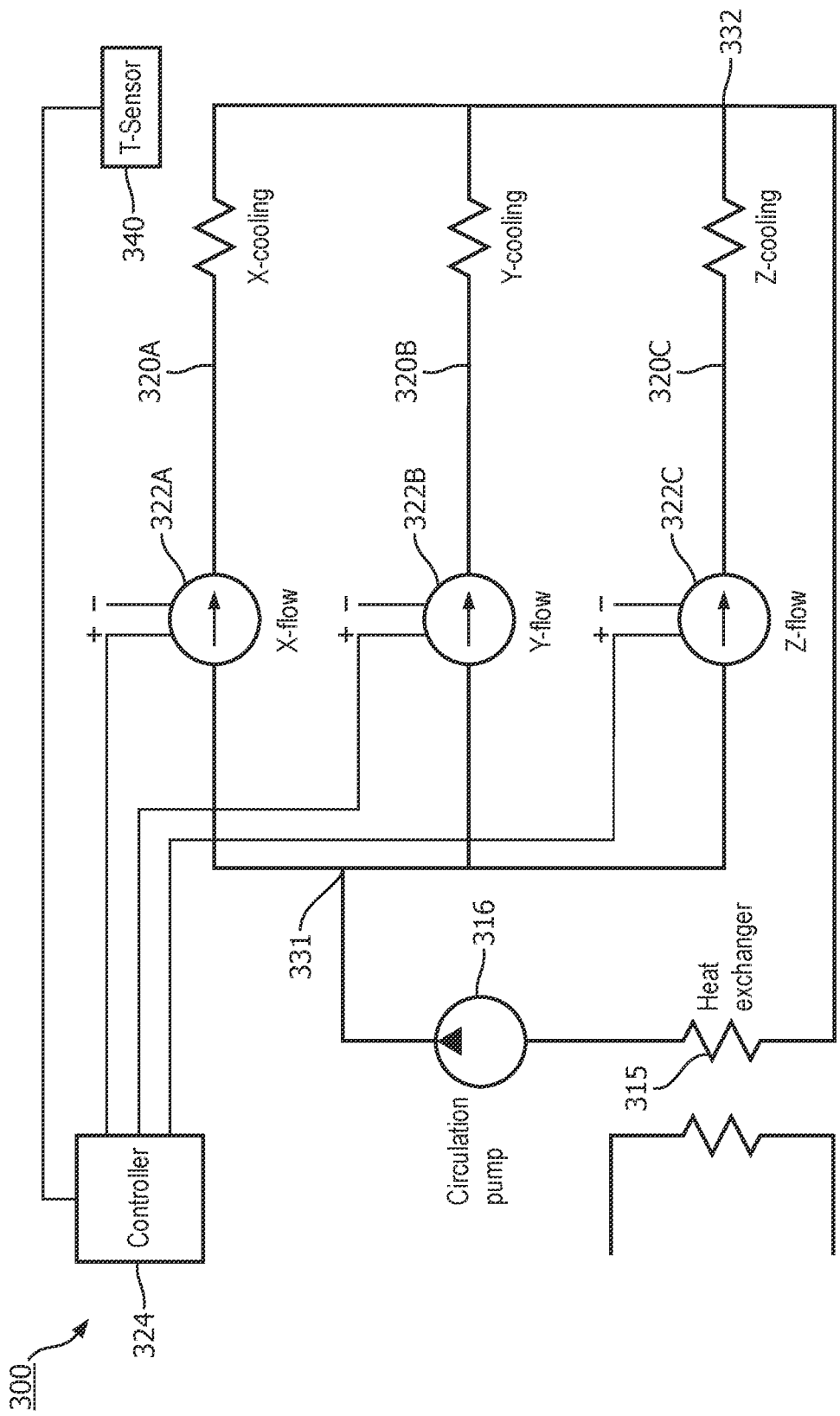
FIG. 3a is a schematic block diagram of a cooling system for a gradient coil apparatus.

FIG. 3a is a schematic block diagram of a cooling system 300 for a gradient coil apparatus e.g. 207 in accordance with an example of the present disclosure. The cooling system 300 comprises cooling circuits 320A-C for the respective gradient coils of the gradient coil apparatus 207. A cooling circuit 320A-C may consist of a coolant pipe or coolant tube. The cooling circuits 320A-C are connected to a heat exchanger 315 and a circulation pump 316.

The cooling circuit 320A is used for cooling the X gradient coil. The cooling circuit 320A comprises a flow control device 322A that is connected to a controller 324. The flow control device 322A may be used to control the amount of coolant that flows through the cooling circuit 320A. For example, the flow control device 322A may comprise a control valve having a valve actuator or valve positioner for setting the valve to a position corresponding to a predefined flow rate as defined or indicated by a signal received by the flow control device from the controller 324.

The cooling circuit 320B is used for cooling the Y gradient coil. The cooling circuit 320B comprises a flow control device 322B that is connected to the controller 324. The flow control device 322B may be used to control (e.g., increase or decrease) the amount of coolant that flows through the cooling circuit 320B.

The cooling circuit 320C is used for cooling the Z gradient coil. The cooling circuit 320C comprises a flow control device 322C that is connected to the controller 324. The flow control device 322C may be used to control (e.g., increase or decrease) the amount of coolant that flows through the cooling circuit 320C.

The cooling circuits 320A-C are connected to a heat exchanger 315 and a circulation pump 316. In the example of FIG. 3, the cooling circuits 320A-C are shown as collectively connected to the heat exchanger 315 and circulation pump 316 at contact points 331 and 332. In another example, the cooling circuits 320A-C may each be connected to a respective heat exchanger and circulation pump.

Controller 324 is configured to control the temperature of the coolant in the cooling circuits 320A-C. This control may be performed independently for each of the cooling circuits 320A-C. Controller 324 may include various types of control circuitry, digital and/or analog, and may include a microprocessor, microcontroller, application specific integrated circuit (ASIC), or other digital and/or analog circuitry configured to perform various input/output, control, analysis and other functions to be described herein.

Controller 324 is configured to adapt the coolant temperature based on the heat load. For example, the heat load may be determined using a temperature sensor 340. The temperature sensor 340 may be placed in proximity of the cooling circuits 320A-C in order to measure and monitor the coolant temperature. A temperature signal indicating the coolant temperature is provided from the temperature sensor 340 to controller 324. Controller 324 may then adjust the flow of the coolant through the cooling circuits 320A-C via flow control devices 322A-C and thereby increase or decrease the cooling effort to maintain the coolant at a desired temperature. It may be advantageous to base the control on the measured temperature at the outlets of the cooling circuits, with the objective to adjust the flows such that the temperature rise in each cooling circuit may be the same. In one example, more temperature sensors can be used e.g. each cooling circuit may be assigned a temperature sensor. With more temperature sensors sensing the temperatures in critical points in the coil a better flow control may be possible.

The control may be performed during or before a MR scan starts. For example, during a MR scan, as the heat load increases as a result of heat generated by the gradient coils, controller 324 may receive a signal from the temperature sensor 340 indicating the heat load caused by each of the gradient coils 324. Based on the received signal, controller 324 may instruct the flow control devices 322A-C to regulate or adjust the flow of the coolant in at least part of the cooling circuits 320A-C in accordance with the measured heat load received in the signal. For example, the flow control devices may comprise valves that can be electrically actuated.

Figure 3B:
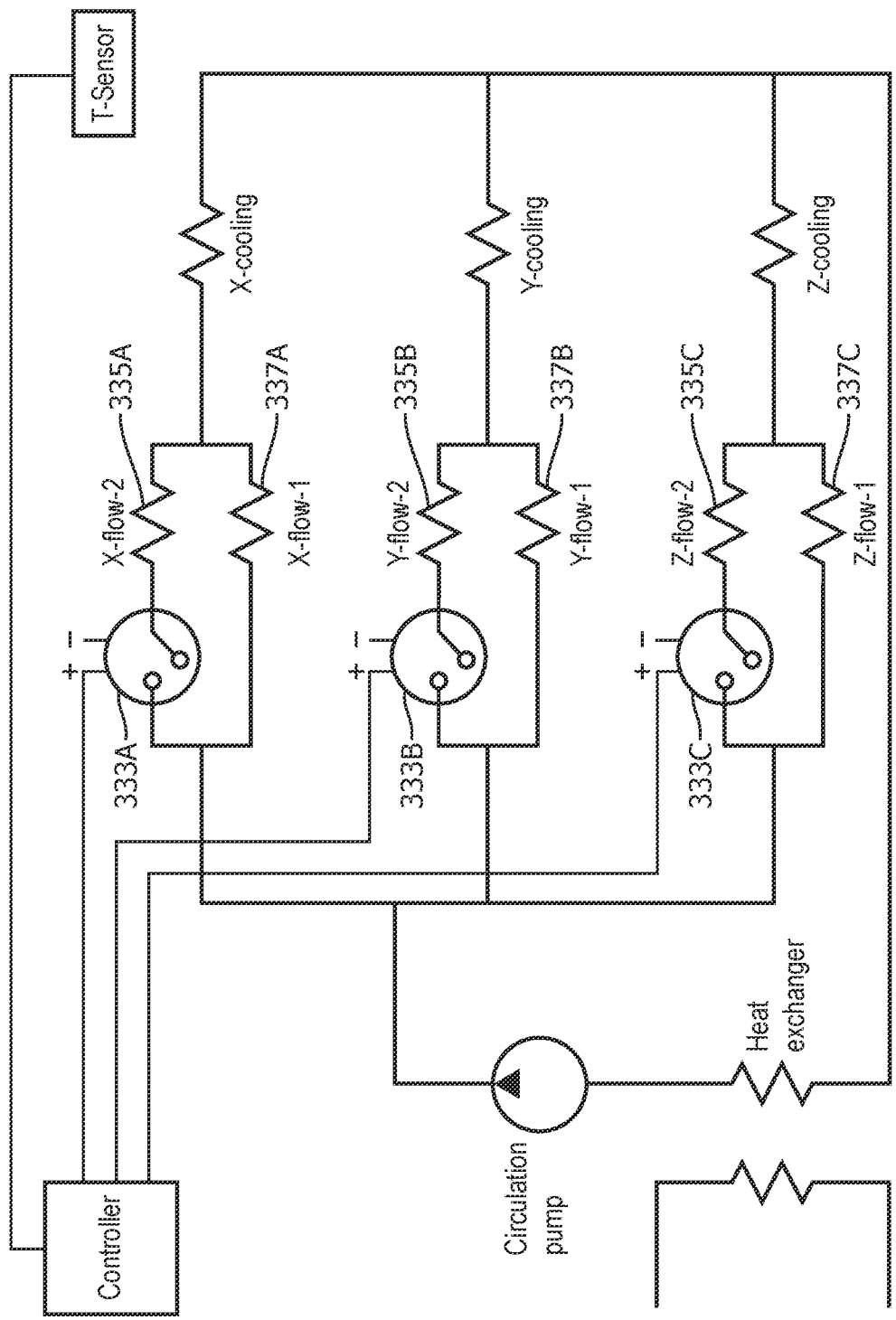
FIG. 3b shows a block diagram of a binary implementation of the cooling system of FIG. 3a, FIG. 4 is a flowchart of a method for cooling a gradient coil apparatus.

FIG. 3b shows a block diagram of a binary implementation of the coolant flow adjustment concept, where each flow control valves 322A-C of the cooling system 300 is replaced by one open/closed valve 333A-C and two flow impedances 335A-C and 337A-C per gradient cooling circuit (or coolant tube). For example, flow control device 322A is replaced by open/closed valve 333A and two flow impedances 335A and 337A. Flow control device 322B is replaced by open/closed valve 333B and two flow impedances 335B and 337B. Flow control device 322C is replaced by open/closed valve 333C and two flow impedances 335C and 337C. Opening a valve (333A-C) reduces the flow impedance and increases the flow rate for the corresponding coolant tube. With suitable selection of flow impedances, it is possible to achieve an approximately two-fold increase of the flow rate in the cooling circuit when the valve opens.

The flow impedances to be used in the binary implementation may be configured as follows. Assuming, for example, the pressure drop along a pipe with water flowing through it is proportional to the square of the flow rate (Darcy-Weissbach law). In this case, the flow impedance (e.g. 337A) parallel to the valve (e.g. 333A) may have to be approximately 3 times the flow impedance of the cooling circuit (e.g. 320A) in the gradient coil and the flow impedance (e.g. 335A) directly in series with the valve (333A) has to be much smaller (e.g. at most 10% of the flow impedance of the cooling circuit) than that of the cooling circuit to get a factor 2 more flow in the channel with the open valve. An operating condition that all three gradient channels need to have the same flow rate can be achieved with all three valves closed. This flow distribution can also be created by opening all three valves, where two valves need to be closed if the flow in one channel is to be made greater.

Figure 4:
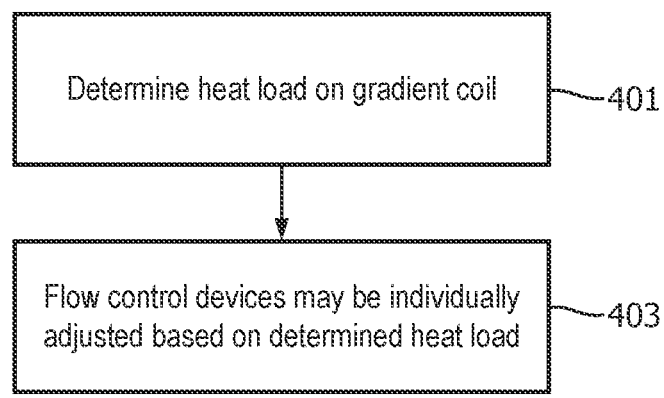

FIG. 4 is a flowchart of a method for cooling a gradient coil apparatus e.g. 207 of a magnetic resonance imaging, MRI, system 100.

In step 401, the heat load of the gradient coil apparatus 207 may be determined. For example, a heat load on a gradient coil may be determined based on a desired use of the gradient coil. The heat load may be predicted based on how the MRI system 100 is going to be used. A gradient coil generates heat during scanning processes because a pulse electric current is repeatedly supplied thereto according to a pulse sequence. The pulse sequence may be used to predict the heat load that is going to be produced by each gradient coil of the gradient coil apparatus 207. The heat load determination may for example be performed by scan controller 131 or controller 124. The controller 124 may have access to the scan setting details of the MRI system 100 such as the pulse sequences to be used for MR acquisition using the MRI system 100 etc.

The usefulness of coolant flow control is illustrated by a typical example. Assuming that a gradient coil assembly with coil resistances of 200 milliohm, cooled by a water cooling system with a total flow rate of 15 liters per minute. The total flow rate is the rate of the coolant that comes from the circulation pump 316. If a certain scan results in RMS current amplitudes of 100, 200 and 300 amperes in the X, Y and Z coils, the highest temperature rise would be over 50 degrees if the 15 l/min flow would be equally split over the three coolant tubes (assuming for simplicity that the heat coil-to-coil heat transfer is small). However, setting the flow rates to 1.1, 4.3 and 9.6 l/min for X, Y and Z respectively, all three gradient coils would exhibit a temperature rise of only 27 degrees. In order to achieve the same low temperature rise with uncontrolled flow distribution, the flow delivered by the cooling system would have to be almost doubled, from 15 to 29 l/min.

| Channel | Resistance (ohm) | RMS current (A) | Dissipation (kW) | dT @ 5 l/min | Opt. flow (l/min) | dT opt |
|---|---|---|---|---|---|---|
| X | 0.2 | 100 | 2.0 | 5.7 | 1.1 | 26.7 |
| Y | 0.2 | 200 | 8.0 | 22.9 | 4.3 | 26.7 |
| Z | 0.2 | 300 | 18.0 | 51.5 | 9.6 | 26.7 |

Using the RMS current to estimate the heating effect of a gradient pulse pattern is a bit simplistic; if eddy-current heating comes into play then the exact waveform in each channel should be considered and a more sophisticated dissipation model is then required, but independent of the details of such a model, if the estimated dissipation per channel varies widely from channel to channel, it is advantageous to optimize the flow distribution.

The temperature rise (dT) may be related to dissipation and flow-rate by the formula $dT=14.3 \times dissipation/flow$, with temperature in degrees C., dissipation in kW and flow in liters/minute, assuming that the coolant is water. It is the specific heat of water that leads to the number 14.3. A desired dT may be obtained by adjusting the flow rate value for each cooling circuit.

With the same gradient operating parameters as in the earlier example, the binary flow control of FIG. 3b would lead to a maximum temperature increase of 34 degrees if the flow rate in the Z-cooling circuit is doubled by opening the valve (the total flow delivered by the cooling system is still 15 liters/min).

| Channel | Resistance (ohm) | RMS current (A) | Dissipation (kW) | dT @ 5 l/min | adjusted flow | dT adj. |
|---|---|---|---|---|---|---|
| X | 0.2 | 100 | 2.0 | 5.7 | 3.8 | 7.6 |
| Y | 0.2 | 200 | 8.0 | 22.9 | 3.8 | 30.5 |
| Z | 0.2 | 300 | 18.0 | 51.5 | 7.5 | 34.3 |

With such a binary flow control system, a useful operating strategy is to keep all flow control valves closed except when the dissipation in one gradient channel is more than two times the dissipation in any of the other channels. Such a load condition is very likely to occur periodically when executing a ZTE imaging sequence.

In another example, the heat load may be determined by measuring the outlet temperature of the coolant in the cooling circuits 220A-C during the scanning process or by measuring the total resistance of the gradient coil. This method may be advantageous in case the distribution of the heating of the gradient channels changes during scanning process. A particular example of this case is the ZTE scanning method, where the vector sum of the three gradients is constant in time, but the gradient direction is slowly rotated over the duration of a scan.

In step 403, the flow control devices may be individually adjusted in accordance with the determined heat load. For example, in case the heat generated by the gradient coil has increased during a scanning process, the flow rate of the coolant may be increased accordingly for the purpose of lowering the temperature of the gradient coil.

The adjusting of a flow control device 222A-C may be performed by adjusting an operating parameter of the flow control device 222A-C. The operating parameter comprises at least one of flow rate of the coolant in the flow control device 222A-C and the inlet temperature of the coolant in the flow control device 222A-C. For example, the adjusting of a flow control device may comprise adjusting the flow rate and the inlet temperature.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage may be any volatile or non-volatile computer-readable storage medium.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the C programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, bluetooth connection, wireless local area network connection, TCP/IP connection, ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) display, Electroluminescent display (ELD), Plasma display panel (PDP), Liquid crystal display (LCD), Organic light-emitting diode display (OLED), a projector, and Head-mounted display.

Magnetic Resonance (MR) data is defined herein as being the recorded measurements of radio frequency signals emitted by atomic spins using the antenna of a magnetic resonance apparatus during a magnetic resonance imaging scan. Magnetic resonance data is an example of medical imaging data. A Magnetic Resonance (MR) image is defined herein as being the reconstructed two or three dimensional visualization of anatomic data contained within the magnetic resonance imaging data.

LIST OF REFERENCE NUMERALS 100 magnetic resonance imaging system
104 magnet
106 bore of magnet
107 gradient coil system
108 imaging zone
110 magnetic field gradient coils
111 computing system
112 magnetic field gradient coil power supply
114 radio-frequency coil
115 RF amplifier
118 subject
120 coolant pipe
122 flow control device
123 processor
124 controller
125 hardware interface
127 memory
131 scan controller
207 gradient coil system
210 gradient coil
215 heat exchanger
216 circulation pump
217 flow direction
218 pipe
220 coolant pipe
222 flow control device
224 controller
300 cooling system
315 heat exchanger
316 circulation pump
320 coolant pipe
322 flow control device
324 controller
331 contact point
332 contact point
333A-C open/closed valve
335A-337C impedance.

The invention claimed is:

1. A gradient coil system for a magnetic resonance imaging(MRI) system, the gradient coil system comprising:
a plurality of gradient coils for applying a gradient magnetic field to a target volume;
the gradient coil system having gradient channels, each channel having associated a gradient coil and current supply for supplying the gradient coil with electrical current to generate a gradient magnetic field in the direction the channel is associated with,
at least one coolant tube per gradient coil for cooling the gradient coil, the coolant tubes being connected to respective flow control devices; the flow control devices being provided with individual gradient channels so as to independently control the flow of coolant for the respective gradient channels and
a controller coupled to the coolant tubes configured to control each flow control device of the flow control devices for adjusting the flow of a coolant in the respective coolant tube, wherein the controller is configured to control the flow control device on the basis of heat load caused by the respective gradient coil.

2. The gradient coil system of claim 1, wherein the heat load is a predicted heat load based on planned MR acquisition pulse sequences for MR data acquisition.

3. The gradient coil system of claim 2, wherein the flow control devices are further adjustable on the basis of an outlet temperature of the coolant during the MR data acquisition after the coolant has passed the respective coolant tube.

4. The gradient coil system of claim 1, wherein the heat load is a measured outlet temperature of the coolant during the MR data acquisition.

5. The gradient coil system of claim 1, wherein the flow control devices are automatically controllable.

6. The gradient coil system of claim 1, wherein a flow control device of the flow control devices comprises a valve having a switching loop for changing the valve from an open to a closed position or from the closed to the open position.

7. The gradient coil system of claim 1, wherein a flow control device of the flow control devices comprises a valve having a valve actuator for setting the valve to a position corresponding to a predefined flow rate of the coolant for absorbing the heat load.

8. The gradient coil system of claim 1, wherein a flow control device of the flow control devices comprises open/closed valve and two flow impedances.

9. The gradient coil system of claim 1, wherein the coolant tubes are hollow conductors of the gradient coils or coolant pipes in contact with the gradient coils.

10. The gradient coil system of claim 1, the at least one coolant tube comprising multiple parallel tubes.

11. A magnetic resonance imaging system comprising the gradient coil system of claim 1.

12. A method for cooling a gradient coil system of a magnetic resonance imaging (MRI) system, the gradient coil system comprising a plurality of gradient coils for applying a gradient magnetic field to a target volume, the gradient coil system having gradient channels, each channel having associated a gradient coil and current supply for supplying the gradient coil with electrical current to generate a gradient magnetic field in the direction the channel is associated with, coolant tubes for cooling the gradient coils, the coolant tubes being connected to respective flow control devices, the flow control devices being provided with individual gradient channels so as to independently control the flow of coolant for the respective gradient channels and the method comprising:
determining a heat load of the gradient coil system;
controlling each flow control device of the flow control devices in accordance with the determined heat load, thereby adjusting the flow of a coolant in the respective coolant tube.

13. The method of claim 12, wherein controlling the flow control device comprises adjusting an operating parameter of the flow control device, and sending a control signal for operating the flow control device in accordance with the adjusted operating parameter, the operating parameter comprising at least one of: flow rate of the coolant in the flow control device and an inlet temperature of the coolant in the flow control device.

14. A computer program product comprising machine executable instructions for execution by a processor, wherein execution of the machine executable instructions causes the processor to perform the method of claim 12.

* * * * *